(12) United States Patent
Reggio

(10) Patent No.: US 7,199,502 B2
(45) Date of Patent: Apr. 3, 2007

(54) VOLTAGE BOOSTER CIRCUIT FOR POWERING A PIEZOELECTRIC ACTUATOR OF AN INJECTOR

(75) Inventor: Paolo Reggio, Orbassano (IT)

(73) Assignee: C.R.F. Societá Consortile per Azioni (IT)

( * ) Notice: Subject to any disclaimer, the term of this patent is extended or adjusted under 35 U.S.C. 154(b) by 170 days.

(21) Appl. No.: 10/891,623

(22) Filed: Jul. 15, 2004

(65) Prior Publication Data

US 2005/0057119 A1    Mar. 17, 2005

(30) Foreign Application Priority Data

Jul. 15, 2003    (IT)    ............ TO2003A0550

(51) Int. Cl.
*H01L 41/08*      (2006.01)

(52) U.S. Cl. .................................................. 310/317

(58) Field of Classification Search ........... 310/316.01, 310/316.03, 317

See application file for complete search history.

(56) References Cited

U.S. PATENT DOCUMENTS

| 4,333,434 | A | | 6/1982 | Brunais et al. ............. 123/478 |
|---|---|---|---|---|
| 4,404,502 | A | | 9/1983 | Magori et al. .............. 318/116 |
| 4,767,959 | A | * | 8/1988 | Sakakibara et al. .......... 310/317 |
| 5,299,739 | A | * | 4/1994 | Takahashi et al. ....... 239/102.2 |
| 6,995,496 | B1 | * | 2/2006 | Hagood et al. ............. 310/317 |

OTHER PUBLICATIONS

European Search Report for EP 04 10 3376 (Dec. 6, 2005).

* cited by examiner

*Primary Examiner*—Mark Budd
(74) *Attorney, Agent, or Firm*—Howrey LLP

(57) ABSTRACT

There is described a voltage booster circuit for powering a piezoelectric actuator of an injector, and having a first and a second input terminal supplied with an input voltage; a first and a second output terminal supplying an output voltage greater than the input voltage, the second input terminal and second output terminal being connected to each other over a common line; a first and a second inductor coupled magnetically and connected in series between the first input terminal and the first output terminal; a capacitor connected between the first output terminal and the second output terminal; and a controlled switch connected between the intermediate node between the first and second inductor, and the second input terminal and second output terminal, and which switches between a closed operating state, to permit charging of the first inductor by the input voltage, and an open operating state, to permit transfer of the charge stored in the first inductor to the capacitor via the second inductor.

5 Claims, 2 Drawing Sheets

VOLTAGE BOOSTER CIRCUIT FOR POWERING A PIEZOELECTRIC ACTUATOR OF AN INJECTOR

CROSS REFERENCE TO RELATED APPLICATIONS

The present application claims priority to Italian Patent Application Ser. No. TO2003A 000550 filed Jul. 15, 2003.

1. Field of the Invention

The present invention relates to a voltage booster circuit for powering piezoelectric injectors.

2. Description of Related Art

As is known, many recently designed injectors feature piezoelectric actuators, which have a number of advantages with respect to electromagnetic types. In particular, they provide for extremely fast response (e.g. less than 100 μs) and permit proportional control, i.e. can even be opened only partly, depending on the supply voltage (whereas, as is known, electromagnetic actuators operate solely in ON/OFF mode).

Piezoelectric actuators, however, must be supplied with voltages in the order of hundreds of volts (150–200 V) produced by special booster circuits for boosting the (12 V) voltage of the vehicle battery by at least one order of magnitude.

Known voltage booster circuits normally used for powering piezoelectric injectors have the following layouts:
Boost;
Flyback;
Forward.

FIG. 1 shows a known Boost layout.

The transfer function of the Boost voltage booster circuit shown is:

$$\frac{V_o}{V_i} = \frac{1}{1-D}$$

where D is the duty cycle value controlling switching of switch S in FIG. 1.

A Boost voltage booster circuit is straightforward and inexpensive by requiring no custom component parts, i.e. specially designed for that particular circuit.

Alongside the above advantages, however, Boost circuits also have various drawbacks:

whereas the input current of a Boost circuit is adequately filtered by inductance L (FIG. 1), the circuit has a highly pulsating output current, so that the capacitor C2, which must withstand high voltages and severe current ripple, must be physically large, but can still be damaged easily;

Boost voltage booster circuits only operate correctly when the output-input transformation ratio is less than 10; in many practical applications, this may not be enough to supply the injectors with sufficient voltage (as, for example, during engine start-up, when the battery voltage falls well below the rated 12 volts);

in continuous operating mode, the transfer function of a Boost voltage booster circuit has a zero in the right half-plane, which considerably limits the bandwidth, whereas, in discontinuous operating mode, the problem is overcome by tolerating higher current peaks; and small variations in duty cycle D produce considerable variations in output voltage, in that:

$$\frac{\partial\left(\frac{V_o}{V_i}\right)}{\partial D} = \frac{1}{(1-D)^2}$$

FIG. 2 shows a known Flyback voltage booster circuit.
The transfer function performed is:

$$\frac{V_o}{V_i} = n \cdot \frac{D}{1-D}$$

where the n term takes into account the presence of coupled inductors.

A Flyback booster circuit has the advantage of having a galvanically insulated output, and permits the generation of a number of, though not finely regulated, output voltages using a number of coupled inductors.

Flyback voltage booster circuits, however, have various drawbacks:

highly pulsating input and output currents, so that the capacitors C1 and C2 (FIG. 2), which must withstand severe current ripple, must be large, but can still be damaged easily;

as with Boost voltage booster circuits, in continuous operating mode, the transfer function of a Flyback voltage booster circuit has a zero in the right half-plane, which imposes a drastic reduction in the bandwidth of the system;

a Flyback voltage booster circuit comprises two coupled inductors, and, since the ratios between the turns are a specific design feature, must therefore employ custom components;

the duty cycle must be limited (normally to 40%, the other 10% being used to improve response during sharp transient states) to avoid saturating the magnetic circuit cores.

FIG. 3 shows a Forward booster circuit.
The input-output voltage equation is:

$$\frac{V_o}{V_i} = n \cdot D$$

where n is the turn ratio between the primary and secondary winding of the transformer; and D is the duty cycle controlling switch S (FIG. 3).

Forward voltage booster circuits have the advantage of a galvanically insulated output, and, having no zeroes in the right half-plane, as in Boost and Flyback voltage booster circuits, can operate safely in continuous mode. Moreover, output current and voltage ripple can be controlled by sizing the output filter inductance $L_f$; and, as compared with a Flyback booster circuit, voltage and current stress of the components is on the whole lower.

Forward voltage booster circuits, however, have a number of drawbacks:

comprising a transformer, a Forward booster circuit necessarily calls for custom components, since the transformation ratio is a specific design feature, and commonly used commercial components almost never comprise a tertiary winding;

the duty cycle must be limited (normally to 40%, the other 10% again being used to improve response) to avoid saturating the transformer cores; and output current ripple is still present; as stated, this may be smoothed by increasing filter inductance $L_f$ (FIG. 3), even though this inevitably means increasing the overall size of the magnetic component.

SUMMARY OF THE INVENTION

It is an object of the present invention to provide a voltage booster circuit with a different layout from the known ones described above.

More specifically, it is an object of the present invention to provide a voltage booster circuit with a straightforward layout, and which provides for greatly reducing output current ripple to reduce the size of the output capacitor.

According to the present invention, there is provided a voltage booster circuit for powering a piezoelectric actuator of an injector, as claimed in claim 1.

DESCRIPTION OF THE FIGURES

A preferred, non-limiting embodiment of the invention will be described by way of example with reference to the accompanying drawings, in which.

DETAILED DESCRIPTION OF THE INVENTION

Figure 1:
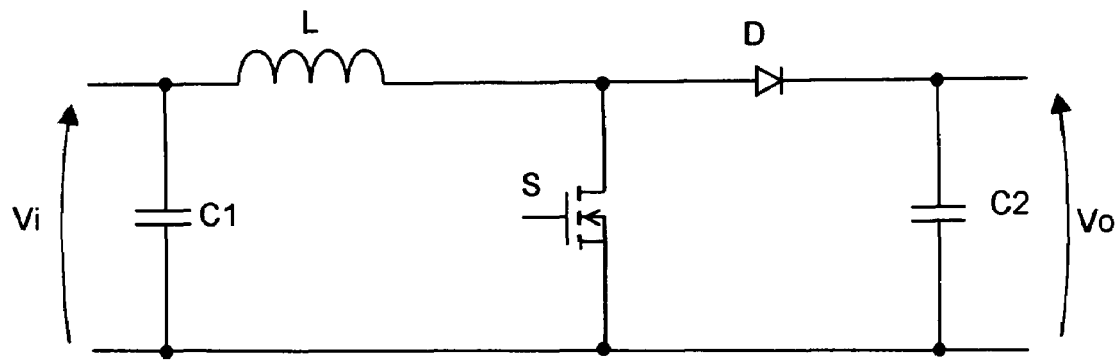
FIG. 1 shows a known Boost-layout voltage booster circuit.
Figure 2:
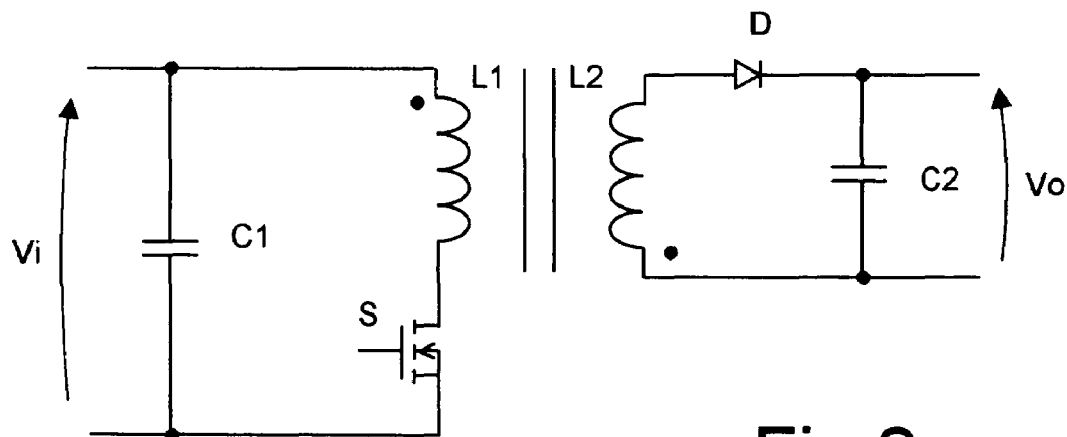
FIG. 2 shows a known Flyback-layout voltage booster circuit.
Figure 3:
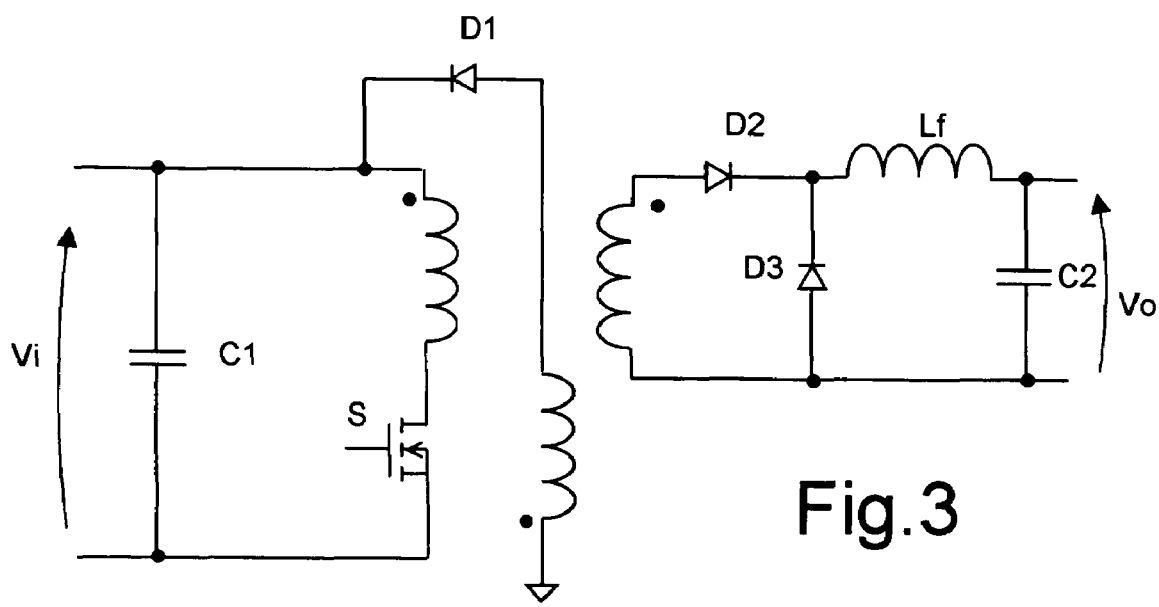
FIG. 3 shows a known Forward-layout voltage booster circuit.
Figure 4:
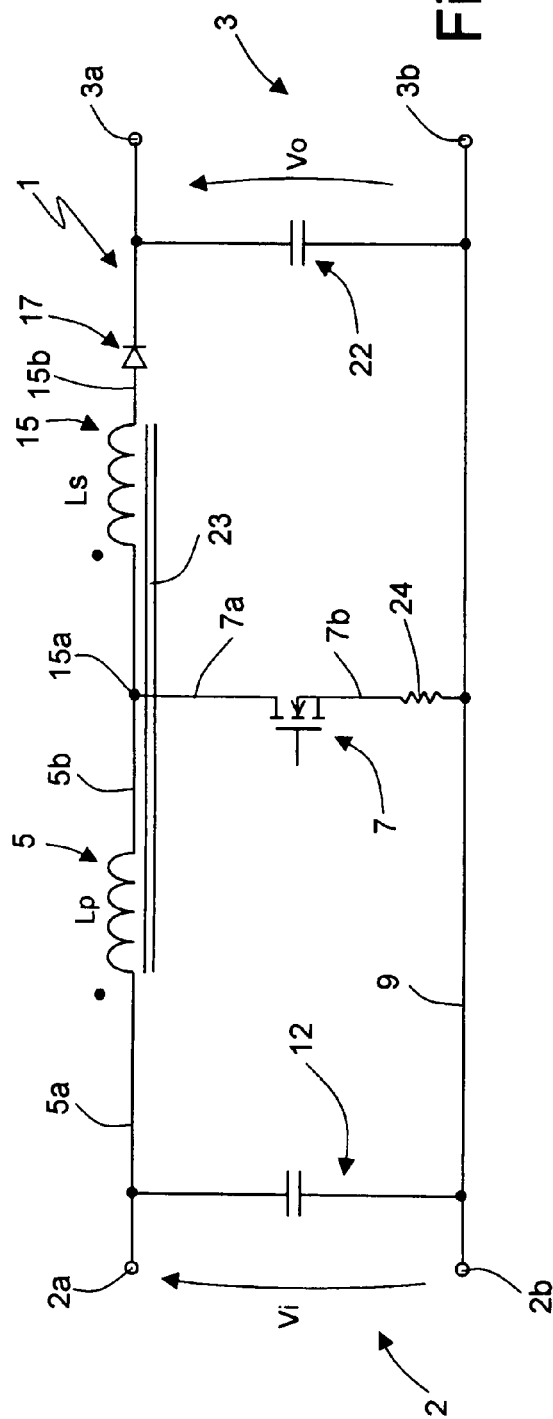
FIG. 4 shows a voltage booster circuit in accordance with the teachings of the present invention.

Number 1 in FIG. 4 indicates as a whole a voltage booster circuit for powering at least one piezoelectric actuator (not shown) of an injector (not shown), in particular a diesel engine injector.

Voltage booster circuit 1 comprises an input 2 supplied with a direct input voltage Vi (in particular, the 12 V direct voltage supplied by a vehicle battery); and an output 3 having an output voltage Vo that can be used to power a piezoelectric actuator (not shown) of an injector (not shown).

Voltage booster circuit 1 comprises a first inductor 5 (of inductance Lp) having a first terminal 5a connected to a first terminal 2a of input 2, and a second terminal 5b communicating with a first terminal 7a of a solid-stage switch 7 having a second terminal 7b communicating with an electric line 9. Solid-state switch 7 is conveniently defined by a field-effect (e.g. MOS) transistor.

A first terminal of electric line 9 defines a second terminal 2b of input 2; and a first capacitor 12 is interposed between the first and second terminal 2a, 2b of input 2.

A second inductor 15 (of inductance Ls) has a first input terminal 15a connected to second terminal 5b of inductor 5, and a second input terminal 15b communicating via a diode 17 with a first terminal 3a of output 3. A second terminal 3b of output 3 is defined by a second terminal of electric line 9; and a second capacitor 22 is interposed between the first and second terminal 3a, 3b of output 3.

According to the present invention, first inductor 5 is coupled magnetically to second inductor 15. More specifically, the first and second inductor are defined by respective turns wound about the same core 23. Conveniently, first inductor 5 comprises N turns, and second inductor 15 comprises kN turns, where k>1. The k value can be an integer or a fractional value.

In actual use, solid-state switch 7 is switched to operate voltage booster circuit 1.

Capacitor 12 between the two input terminals 2a and 2b of voltage booster circuit 1 provides for filtering the noise generated by switching solid-state switch 7.

More specifically, when switch 7 is closed (ON phase), current increases substantially steadily in first inductor 5; and the value of the current can be monitored, for example, using a measuring resistor 24 in series with switch 7. At this phase, diode 17 is disabled, so no current flows in second inductor 15.

When the current carried by inductor 5 reaches a given threshold value $I_{PK1}$, switch 7 is opened by a control circuit (not shown) described later on. Rapid opening of switch 7 (OFF phase) causes a sharp variation in the voltage in first inductor 5, which is inverted and also affects second inductor 15, diode 17 starts conducting, and the current carried by inductor 5, which is now decreasing substantially steadily, is applied to second capacitor 22, which charges.

More specifically, when switch 7 opens, second inductor 15 is in series with first inductor 5, and the total inductance value of the circuit increases. Since the inductance value of an inductor is related to the geometry of the core and to the square of the number of turns, the total inductance value Leq—which equals the sum of the effects of the two series inductors 5 and 15—equals $(1+k)^2$ times the value of inductance Lp of inductor 5, i.e.:

$$Leq=(1+k)^2 Lp$$

This is because both inductors 5, 15 are wound with the same winding, and the magnetic flux links with all the turns of both inductors 5, 15.

Figure 5:
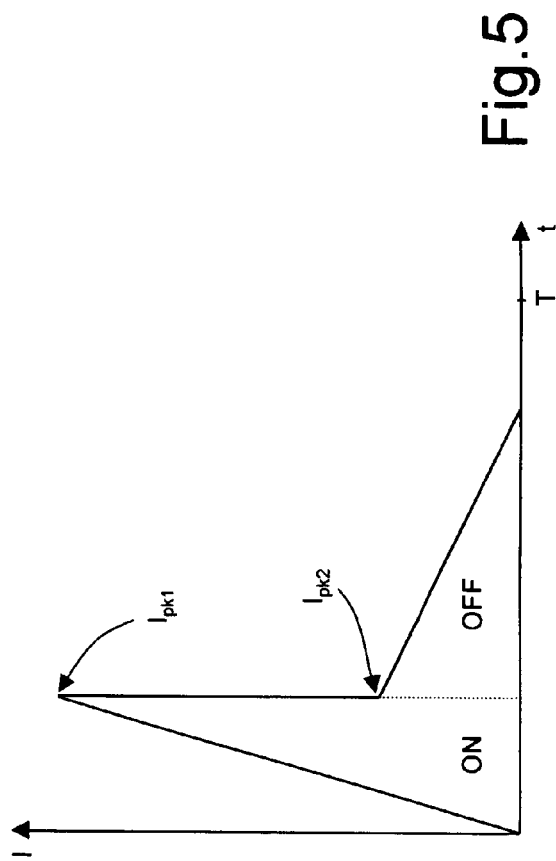
FIG. 5 shows a graph of the current in an inductor forming part of the FIG. 4 voltage booster circuit.

As a direct consequence of the energy-saving principle applied to the ON and OFF phases:

$$\tfrac{1}{2} \cdot Lp \cdot I_{PK1}^2 = \tfrac{1}{2} \cdot Leq \cdot I_{PK2}^2$$

i.e.

$$\tfrac{1}{2} \cdot Lp \cdot I_{PK1}^2 = \tfrac{1}{2} \cdot (1+k)^2 Lp \cdot I_{PK2}^2$$

so that:

$$I_{PK2}=I_{PK1}/(1+k)$$

i.e. the current $I_{PK2}$ flowing in the OFF phase, in which switch 7 is open, is reduced by a factor (1+k) with respect to the value reached at the end of the ON phase, as shown in FIG. 5, where T indicates the value of the period controlling switching of switch 7. Repetition of the above operations (ON and OFF phases) produces a charge current of capacitor 22 oscillating slightly about a desired charge current value. Capacitor 22, which is kept charged by an appropriate duty cycle as soon as the voltage at its terminals reaches the desired value, is therefore charged with current with a very low peak value, almost as though inductor 5 were an ideal current source.

Moreover, being proportional to the peak value of the current, the ripple current value in second capacitor 22 is also reduced by factor (1+k). Second inductor 15 therefore provides for reducing the current oscillation to be withstood by capacitor 22, which can therefore be smaller than the output capacitor of a Boost voltage booster, is stressed to a lesser degree, and is thus far less subject to breakdowns.

It can also be shown that the transfer function relating input voltage Vi to output voltage Vo is:

$$\frac{V_o}{V_i} = \frac{1 + k \cdot D}{1 - D};$$

whereas the function relating current $I_L$—which is the mean current flow in first inductor 5—to output voltage Vo of voltage booster circuit 1 is:

$$I_L = \frac{(1+k) \cdot V_O}{R \cdot (1-D)}$$

where D is the duty cycle, k is the ratio between the turns of second inductor 15 and first inductor 5, and R is the load resistance.

Since the output voltage can be regulated easily by appropriately selecting k and modifying duty cycle D accordingly, a desired voltage (e.g. about 200V) can be regulated regardless of the type of input supply (12V or 42V).

The voltage booster circuit has control means for effecting closed-loop control as dictated by peak current mode; in particular:

- a first internal current control circuit which imposes a desired current value in first inductor 5 and therefore, via second inductor 15, in the load, and turns switch 7 off when the desired current peak value is reached; this control loop is extremely fast, may typically have a bandwidth equal to ¼ of switching frequency, and is totally unaffected by the imposed output voltage Vo;
- a second voltage control circuit, slower than the current control circuit, which determines the value of output voltage Vo, and compares it with a reference value to obtain a desired current level for use in the above current loop, and so modify the duty cycle controlling switching of switch 7.

The two control circuits described provide protection against possible short-circuiting of voltage booster circuit 1. That is, in the event of a sharp fall in output voltage, so that the voltage control increases the duty cycle, rapid attainment of the peak current value causes the current loop to turn the switch off earlier than the time established by the voltage loop; conversely, in the event the current loop supplies too much current, thus increasing the output voltage, the voltage loop begins reducing the duty cycle.

The following is the mathematical proof of the above transfer function.

More specifically, mathematical proof is based on the state space mean, which is a type of analysis proposed by Middlebrook and Vorperian in the mid-1970s.

This type of analysis is only valid in continuous mode, i.e. when the time constants of the circuit (related to inductance L and capacitance C) are much greater than the switching period of switch 7, which is almost always the case in switch circuits.

In short, two states are examined: a first state, in which switch 7 is closed, and a second state, in which switch 7 is open. The state equations for the currents in the inductors and for the voltages in the capacitors are defined, and the currents and voltages are then averaged in time by multiplying them by the time periods in which the respective equations are valid.

Assuming switch 7 is closed, the first two equations are:

On Phase $$\begin{cases} V_{Lp} = L_P \cdot \frac{di_L}{dt} = V_i \\ i_C = C \cdot \frac{dV}{dt} = -\frac{V}{R} \end{cases}$$

where:

$V_{Lp}$ is the voltage applied to first inductor 5;

$L_p$ is the inductance of first inductor 5;

$i_L$ is the current in first inductor 5;

$V_i$ is the input voltage;

$i_c$ is the current in output capacitor 22;

C is the capacitance of output capacitor 22;

V is the output voltage (constituting the power supply of the piezoelectric actuator); and R is the equivalent load resistance (e.g. 1 kΩ).

Assuming switch 7 is open, the following equations are obtained (bearing in mind that the inductance now is the equivalent inductance, and the voltage is that related to the whole winding);

OFF Phase $$\begin{cases} V_{Leq} = (1+k)^2 L_P \cdot \frac{di_L}{dt} = (V_i - V) \quad \left[ V_{Lp} = \frac{V_{Leq}}{1+k} \right] \\ i_C = C \cdot \frac{dV}{dt} = i'_L - \frac{V}{R} \quad \quad \quad \quad \quad [i_L = (1+k) \cdot i'_L] \end{cases}$$

where:

$V_{Leq}$ is the voltage across the equivalent inductance;

$L_{eq}$ is the equivalent inductance;

$I'_L$ is the current in the equivalent inductance; and k is the turn ratio between the primary and secondary inductor.

Averaging the whole within the switching period, i.e. multiplying by D or (1−D), depending on the time span in which the equations are valid, and substituting the terms in square brackets, give:

$$V_{Lp} = L_P \cdot \frac{di_L}{dt} = V_i \cdot D + \frac{(V_i - V) \cdot (1 - D)}{1 + k}$$

$$i_C = C \cdot \frac{dV}{dt} = \frac{i_L}{1+k}(1-D) - \frac{V}{R}$$

A substitution is then made: in particular, each variable is replaced with a term comprising a constant part (indicated in upper case), and a variable part expressing an infinitesimal variation (indicated by a circumflex accent):

$$x = X + \hat{x}$$

The Laplace transform is then applied to the last two equations, ignoring any infinitesimal terms of an order greater than two:

$$p \cdot L_P \cdot \hat{i}_L = V_i \cdot D + V_i \cdot \hat{d} + \hat{v}_i \cdot D + \frac{(\hat{v}_i - \hat{v}) \cdot (1-D)}{1+k} - \frac{(V_i - V) \cdot \hat{d}}{1+k} + \frac{(V_i - V) \cdot (1-D)}{1+k}$$

$$p \cdot C \cdot \hat{v} = \frac{I_L + \hat{i}_L}{1+k} \cdot (1 - D - \hat{d}) - \frac{\hat{v} + V}{R}$$

Separating the constant terms from the variable terms gives two separate systems of equations:

$$\begin{cases} p \cdot L_P \cdot \hat{i}_L = V_i \cdot \hat{d} + \hat{v}_i \cdot D + \frac{(\hat{v}_i - \hat{v}) \cdot (1-D)}{1+k} - \frac{(V_i - V) \cdot \hat{d}}{1+k} \\ p \cdot C \cdot \hat{v} = \frac{\hat{i}_L}{1+k} \cdot (1-D) - \frac{I_L}{1+k} \cdot \hat{d} - \frac{\hat{v}}{R} \end{cases}$$

$$\begin{cases} 0 = V_i \cdot D + \frac{(V_i - V) \cdot (1-D)}{1+k} \\ 0 = \frac{I_L}{1+k} \cdot (1-D) - \frac{V}{R} \end{cases}$$

The transfer function of the booster circuit is obtained by calculating the constant terms with respect to the output and input voltage ratio, and with respect to the current in the inductor:

$$\begin{cases} \frac{V}{V_i} = \frac{1 + k \cdot D}{1 - D} \quad \leftarrow .t.f - \text{modified-boost} \\ I_L = \frac{V \cdot (1+k)}{R \cdot (1-D)} \end{cases}$$

Substituting the above in the equations relative to minor variations gives:

$$\begin{cases} p \cdot L_P \cdot \hat{i}_L = \frac{(1-D) \cdot V}{1 + k \cdot D} \cdot \hat{d} + \hat{v}_i \cdot D + \\ \qquad \frac{(\hat{v}_i - \hat{v}) \cdot (1-D)}{1+k} - \frac{\left(\frac{(1-D) \cdot V}{1+k \cdot D} - V\right) \cdot \hat{d}}{1+k} \\ p \cdot C \cdot \hat{v} = \frac{\hat{i}_L}{1+k} \cdot (1-D) - \frac{\frac{V \cdot (1+k)}{R \cdot (1-D)}}{1+k} \cdot \hat{d} - \frac{\hat{v}}{R} \end{cases}$$

By zeroing the variations in input voltage $v_i$, the equation relating output voltage $v(p)$ to the variation in duty cycle D can be determined, and can easily be shown to comprise a zero in the right half-plane, and two conjugate complex poles with a negative real part.

The frequency of the zero in the right half-plane is the following:

$$f = \frac{1}{2\pi} \cdot \frac{R \cdot (1-D)^2}{L \cdot (1+k) \cdot (1 + k \cdot D)}$$

Clearly, changes may be made to the voltage booster circuit as described and illustrated herein without, however, departing from the scope of the present invention as defined in the accompanying claims.

What is claimed is:

1. A voltage booster circuit (1) for powering a piezoelectric actuator of an injector, comprising:
    a first input terminal (2a) and a second input terminal (2b) supplied with an input voltage ($V_i$);
    a first output terminal (3a) and a second output terminal (3b) supplying an output voltage ($V_o$) greater than the input voltage ($V_i$), the second input terminal and the second output terminal (2b, 3b) being connected to each other;
    first inductor means (5) and second inductor means (15) coupled magnetically and connected in series between the first input terminal (2a) and the first output terminal (3a);
    first capacitor means (12) connected between the first input terminal (2a) and the second output terminal (2b);
    second capacitor means (22) connected between the first output terminal (3a) and the second output terminal (3b);
    controlled switching means (7) connected between the intermediate node (15a) between the first inductor means (5) and second inductor means (15), and the second input terminal (2b) and the second output terminal (3b), and which switch between a closed operating state, to permit charging of the first inductor means (5) by the input voltage ($V_i$) and an open operating state, to permit transfer of the charge stored in the first inductor means (5) to the capacitor means (22) via the second inductor means (15);
    a measuring resistor (24) connected in series to the controlled switching means (7);
    a diode 17 connected between the second inductor means (15) and the first output terminal (3a), wherein the current of the diode flows from the second inductor means (15) to the first output terminal (3a).

2. The circuit of claim 1, wherein the first inductor means (5) comprises N turns, and the second inductor means (15) comprise kN turns, where k>1.

3. The circuit of claim 1, wherein the first inductor means (5) and the second inductor means (15) are defined by respective turns wound about the same core (23).

4. The circuit of claim 1, further comprising one-way current-conducting means (17) interposed between the second inductor means (15) and the first output terminal (3a).

5. The circuit of claim 1, further comprising second capacitor means (12) interposed between the first input terminal (2a) and the second input terminal (2b).

* * * * *